(12) United States Patent
Gospodinova et al.

(10) Patent No.: US 7,456,505 B2
(45) Date of Patent: Nov. 25, 2008

(54) INTEGRATED CIRCUIT CHIP AND INTEGRATED DEVICE

(75) Inventors: Minka Gospodinova, München (DE); Jochen Thomas, München (DE); Dominique Savignac, Ismaning (DE)

(73) Assignee: Infineon Technologies AG, Munich (DE)

( * ) Notice: Subject to any disclaimer, the term of this patent is extended or adjusted under 35 U.S.C. 154(b) by 136 days.

(21) Appl. No.: 11/192,663

(22) Filed: Jul. 29, 2005

(65) Prior Publication Data

US 2007/0023898 A1  Feb. 1, 2007

(51) Int. Cl.
*H01L 23/48* (2006.01)
(52) U.S. Cl. .................. 257/784; 257/E23.02
(58) Field of Classification Search .......... 257/459, 257/612, 617, 676, 254, 415, 784, E23.02, 257/E29.029
See application file for complete search history.

(56) References Cited

U.S. PATENT DOCUMENTS

| | | | |
|---|---|---|---|
| 6,064,113 A * | 5/2000 | Kirkman | 257/691 |
| 6,221,690 B1 * | 4/2001 | Taniguchi et al. | 438/106 |
| 6,538,336 B1 * | 3/2003 | Secker et al. | 257/786 |
| 6,667,546 B2 | 12/2003 | Huang et al. | |
| 2003/0075812 A1 * | 4/2003 | Cheng et al. | 257/784 |
| 2005/0045987 A1 | 3/2005 | Koo et al. | |
| 2005/0098870 A1 | 5/2005 | Thomas et al. | |
| 2005/0200009 A1 * | 9/2005 | Kang et al. | 257/734 |

FOREIGN PATENT DOCUMENTS

DE  196 31 046 A1  2/1998

* cited by examiner

*Primary Examiner*—W. David Coleman
*Assistant Examiner*—Khiem D Nguyen
(74) *Attorney, Agent, or Firm*—Patterson & Sheridan, L.L.P.

(57) ABSTRACT

Embodiments provide for integrated circuit chip and device having such an integrated circuit, in which different types of pads are arranged in separate rows. In one embodiment the pads are arranged to reduce the loop inductance of corresponding signal and power supply bond wires.

12 Claims, 4 Drawing Sheets

INTEGRATED CIRCUIT CHIP AND INTEGRATED DEVICE

BACKGROUND OF THE INVENTION

1. Field of the Invention

The present invention refers to an integrated circuit chip having a number of pads to connect an integrated circuit. The present invention further refers to an integrated device including a packaged integrated circuit chip and interconnection means.

2. Description of the Related Art

The electrical performance of integrated devices increasingly develops into a limiting factor in high-speed memory packages, e.g. for graphics applications. Proper signal routing, particularly in a package, becomes more and more important for the signal quality. The signal routing comprises the signal trace and the corresponding return path through power and ground planes/traces. One of the main issues is the noise generated by the non-ideal power supply system. To reduce the noise, the inductance of the loop power supply/ground-signal-trace has to be minimized and the required line characteristic impedance has to be maintained constantly along the whole signal path.

Although the loop inductance can be minimized and the required impedance of the package can be achieved by means of routing measures, the bonding wires within the package seem to limit the high frequency package performance. The reason is that there is an additionally remaining inductance for the signal and power lines.

Dual slot FBGA packages reduce the length of bonding wires for power supply planes, but with today's pad arrangement on the chip the inductance of the signal bond wires and the signal-to-power coupling within the bond wire region cannot be affected significantly. Moreover, the distance between the signal and the supply bond wires is limited by the pad pitch and cannot be reduced by shrinking the feature sizes due to restrictions of the bonding equipment.

For example, on a FBGA substrate the signal-to-power/ground loop inductance can be minimized by reducing the total length of the signal/power supply line as much as possible by routing the signal bond wires as close as possible to the corresponding power/ground supply lines and maintaining the trace widths/spacings all along the path constant to achieve a constant line impedance. In the area of the bond channel through which the bond wires are led, a constant impedance cannot be achieved as the bond wires have a predominantly inductive behaviour and the spacings between the signal and power/ground supply bond wires are defined by the chip pad arrangement. Consequently, the result is an impedance discontinuity of bond wires which can only be minimized by shortening the bond wires wherever possible.

One approach used where the overall loop inductance in a high frequency application becomes critical due to the bond wire inductance, is a flip-chip design. However, this approach leads to increased packaging costs.

SUMMARY OF THE INVENTION

The present invention generally provides embodiments of an integrated circuit chip (and methods of manufacturing the same) which can be packaged such that the signal-to-power/ground loop inductance is minimized and the line impedance can be held more constant. In at least one embodiment, an integrated device is provided having a minimized signal-to-power/ground loop inductance and a constant line impedance.

In one embodiment, an integrated circuit chip is provided which comprises a substrate, an integrated circuit included in the substrate and a number of pads arranged on a surface of the substrate and electrically connecting the integrated circuit. The number of pads includes a signal pad for at least one of receiving and outputting a high frequency signal and a power supply pad for receiving a supply potential. The power supply pad is associated to the signal pad to support the transfer of the signal to and from the signal pad. The pads are arranged in a first pad row which includes the signal pad and in a second pad row which includes the power supply pad, wherein the first and second pad rows extend substantially in parallel. From the pads of the second pad row, the power supply pad associated to the signal pad is arranged as that power supply pad in the second pad row being closest to the signal pad in the first pad row.

One benefit of the integrated circuit chip according to at least one embodiment of the present invention is that when bonding the signal pad and the power supply pad with bond wires in a direction substantially perpendicular to the extension of the pad rows, the bond wires can be led closer to each other in comparison to bond wires connected to adjacent pads of one pad row which have to be spaced apart by a minimum pad spacing distance. The integrated circuit chip according to this embodiment of the present invention allows the reduction of the spacing between the bond wires for the signal and for the power/ground supply. As the bond wires for the signal pad and for the power supply pad result in a common loop inductance which is affected by the spacing of the bond wires of their length, this reduction in spacing results in a reduced signal-to-supply loop inductance which substantially improves the high frequency signal transmission over the signal bond wire.

In one embodiment, a signal pad has two or more associated power supply pads to support the transferring of the signal from the signal pad of the second pad row. A first power supply pad and a second power supply pad (associated with a given signal pad) may be arranged to be connected to a power supply potential and a ground potential, respectively. Accordingly, the second power supply pad may also be referred to as a ground pad.

Various relative arrangements of the signal pad and associated power supply pads are contemplated. For example, in one arrangement the pads in the first and second rows are arranged in a substantially linear pattern and the two or more associated power supply pads (in the second row) for a given signal pad (in the first row) may be adjacent to one another. In one embodiment, the pads of the first and second pad rows are arranged in a staggered condition relative to each other. Further, the associated power supply pads may be those pads of the second pad row that are closest to the signal pad in the first pad row. The staggered arrangement of the pads allows for associating two supply pads to the signal pad such that corresponding supply bond wires may both be spaced from the signal bond wire with substantially the same distance.

According to another embodiment of the present invention, the signal pad and one of the associated power supply pads may be arranged as opposing each other in a direction substantially perpendicular to the extension of the pad rows.

In another embodiment, the signal pads and the first and second power supply pads for respective signal pads are arranged in separate parallel rows. For example, the signal pads may be arranged in a first row, the respective first power supply pads may be arranged in a second row and the respective first power supply pads (ground pad) may be arranged in a third row. Further, in a particular embodiment a given signal pad, respective first power supply pad and respective second power supply pad form a row in a direction substantially perpendicular to the extensions of the first, second and third pad rows. Further, it is contemplated that, in a particular embodiment, the second and third rows are on opposite sides of the first row.

According to another embodiment of the present invention, an integrated device is provided which comprises a substrate, an integrated circuit included in the substrate and a number of pads arranged on a surface of the substrate and electrically connecting the integrated circuit. The number of pads includes a signal pad for at least one of receiving and outputting a high-frequency signal and a power supply pad for receiving a supply potential. The power supply pad is associated to the signal pad to support the transferring of the signal to and from the signal pad. The pads are arranged in a first pad row which includes the signal pad and in a second pad row which includes the power supply pad, wherein the first and second pad rows extend substantially in parallel. From the pads of the second pad row, the power supply pad associated to the signal pad is arranged as that pad being closest to the signal pad in the first pad row. The integrated device further includes a redistribution element arranged on the surface of the substrate having a number of contact elements, wherein the number of contact elements includes a power supply contact element and a signal contact element. A first bond wire is provided which connects the power supply pad with the power supply contact element and a second bond wire which connects the signal pad to the signal contact element.

In one embodiment, the integrated device provides an integrated circuit chip which is connected to respective contact elements via bond wires. Due to the pad arrangement on the substrate, the bond wires are spaced apart with a reduced distance compared to the bond wires being connected to adjacent pads in a single pad row which are spaced apart as predetermined by the pad pitch of the pads in the pad row. The reduced spacing between the bond wires reduces the signal-to-power-supply loop inductance in such a way that the high frequency signal transmission to and from the integrated circuit can be improved.

The signal contact element and the power supply contact element may be arranged on the redistribution element so that the first and second bond wires are disposed substantially above/below each other with respect to the surface of the substrate which means that the signal pad, the power supply pad, the signal contact element and the power supply contact element are arranged in line with respect to the surface of the substrate.

The power supply contact element and the signal contact element may each be arranged in respective contact element rows which correspond to or mirror the arrangement of the pads of the first and second pad rows. This is to avoid bond wires crossing each other which would increase the probability of shorts.

According to another embodiment of the present invention, the pads of the first and second pad row are in a staggered arrangement relative to each other. A further power supply pad may be provided which is associated to the signal pad and which is included in the second pad row, wherein from the pads of the second pad row the power supply pad and the further power supply pad both associated to the signal pad are arranged as those pads closest to the signal pad in the first pad row.

A further power supply pad may be provided in the second pad row, wherein a further power supply contact element is provided on the redistribution element and wherein a third bond wire is provided to connect the further power supply contact element to the further power supply pad.

The power supply pad and the further power supply pad may be arranged to be connected to a power supply potential and a ground potential, respectively, via a power supply power contact element and a ground potential contact element.

In one embodiment, the signal pad and the power supply pad are arranged opposite to each other in a direction substantially perpendicular to the extension of the pad rows.

According to an embodiment of the present invention, the signal contact element and the power supply contact element are arranged on the redistribution element in line with the signal pad and the power supply pad such that the first and second bond wires are disposed substantially above/below each other with respect to the surface of the substrate.

A further power supply pad may be provided which is associated to the signal pad, wherein a third pad row is provided which includes the further power supply pad, wherein the power supply pad, the further power supply pad and the signal pad are arranged in line in a direction perpendicular to the length dimensions of the pad rows.

A further power supply contact element is provided which is connected with the further power supply pad by a third bond wire, wherein the signal contact element, the power supply contact element and a further power supply contact element are arranged on the redistribution element in line with the signal pad, the power supply pad and the further power supply pad such that the first, second and third bond wires are disposed substantially above/below each other with respect to the surface of the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and, unless explicitly present, are not considered elements or limitations of the appended claims.

Figure 1A:
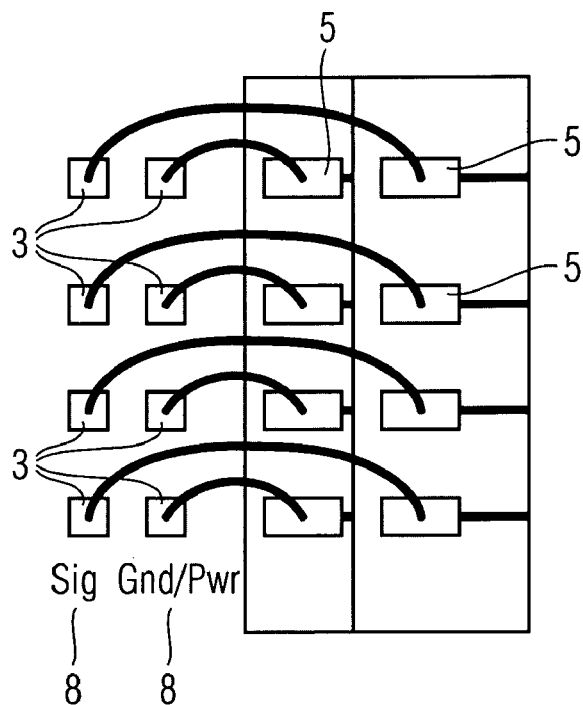
FIG. 1A shows a top view of an integrated device package according to a first embodiment of the present invention.
Figure 1B:
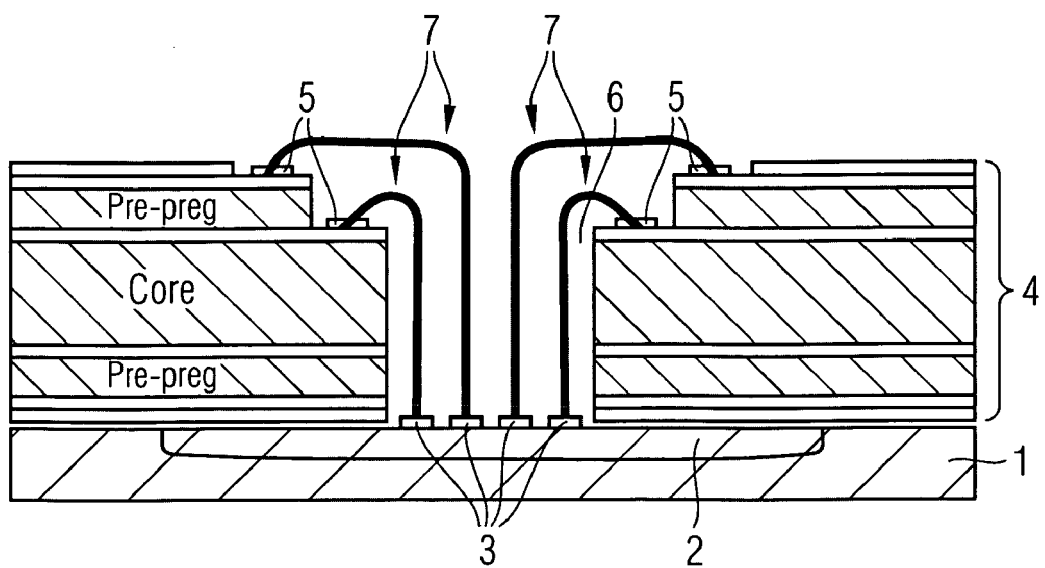
FIG. 1B shows a cross-sectional view through the integrated device package of the embodiment of FIG. 1A.

With regard to the FIGS. 1A and 1B, a section of an FBGA device is depicted. The device includes a substrate 1 in which an integrated circuit 2 is implemented, e. g. a memory circuit as DRAM, a logic circuit and the like. The integrated circuit comprises one or more integrated circuits to provide a predetermined functionality. The integrated circuit 2 is connected to contact pads 3 on a surface of the substrate by means of a number of patterned metal layers.

On the surface of the substrate 1, a redistribution element 4 is attached having a number of redistribution layers in which a rewiring is provided. Contact elements 5 are arranged on one or more different layers of the redistribution element 4. The redistribution element 4 electrically connects the contact elements 5 with package ports such as solder bumps, solder balls and the like. The redistribution element 4 includes a bond channel 6 through which the contact pads 3 on the surface of the substrate and the contact elements 5 can be connected by means of bond wires 7. In the illustrated embodiment, the bond channel 6 is arranged along a middle line of the substrate 1 with regard to two opposite edges of the substrate 1.

In the illustrated embodiment, the contact pads 3 are arranged in four pad rows 8 which are arranged such that they extend in parallel adjacent to each other. In one embodiment, the pads 3 of the pad rows 8 have a constant pitch (spacing) such that each two pads of two adjacent pad rows oppose/face each other in a direction substantially perpendicular to the extension of the pad rows 8. The pad pitch may be determined by the restrictions of the bonding process and/or the bonding equipment and may not be cable of being shrunk in the same measure as the integrated circuit is shrunk.

The integrated circuit 2 is connected to the contact pads 3 to receive or to output signals such as data signals, address signals, clock signals and the like. Furthermore power supply contact pads are provided on which a predetermined potential is applied to supply power to the integrated circuit 2. By means of the power supply contact pads (of the pads 3), a power or a ground potential can be applied to the integrated circuit.

In an integrated device wherein high-frequency signals have to be transmitted to and from a respective signal contact pad, the signal contact pad is associated to at least one power supply contact pad which receives the respective power or ground potential as a supply. A respective power supply contact pad has to be associated with each of the high frequency signals to support the transferring of the signal on the bond wire connected with the signal contact pads 3 and the receiving of the signal. One reason for this is that the input device or the output driver to which the signal contact pad 3 is connected requires more power the higher the frequency is when receiving and outputting the high frequency signal, respectively. As the bond wires have a high inductance and a resistance, a voltage drop occurs. To reduce the voltage drop on the power supply lines, the power supply for each of the input device and the output driver is supplied for each signal from an external source.

With regard to FIG. 1a, the first pad row (left side) includes signal pads for at least one of receiving and outputting a high-frequency signal. Further, a second pad row (right side) includes respective power supply contact pads for each of the signal pads. In the illustrated embodiment, the respective signal pads and power supply pads oppose each other in a direction substantially perpendicular to the extension of the pad rows.

The contact elements 5 are arranged on both sides of the bond channel 6 such that the pads of the two pad rows 8 shown on the right of FIG. 1b are bonded to respective contact elements 5 arranged on the right hand side of the redistribution element 4 and the pads of the two pad rows 8 shown on the left of FIG. 1b are bonded to the contact elements 5 on the left hand side regarding the bond channel 6.

The use of a number of pad rows (two or more) allows for a bond wire arrangement in a vertical direction wherein the bond wires for the signal and the power potential extend above/below each other with respect to the surface of the substrate. Thus, as illustrated in FIG. 1a, the bond wires of a given signal pad and its respective power supply pads, traverse respective coplanar (but separate, i.e., non-overlapping) paths through a common plane (i.e., the plane of the page) that extends perpendicularly from the surface of the substrate. One benefit of this arrangement is an increased mutual coupling between the signal bond wire and the power supply bond wire which is associated to the signal, resulting in a reduced loop inductance and a constant characteristic impedance. Furthermore, the pad rows can be reduced in length as the pads are distributed on several (e.g., parallel) pad rows. Furthermore, it is possible to provide more power supply pads to further enhance the high frequency signal transmission.

In the following description, elements having the same or similar function are indicated with the same reference signs in the figures.

Figure 2A:
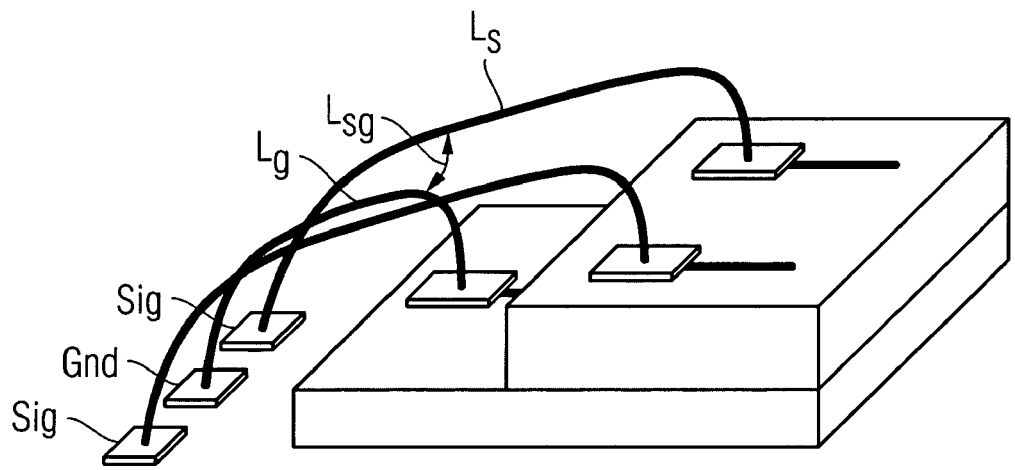
FIG. 2A shows the development of the loop inductance of a prior art device package.
Figure 2B:
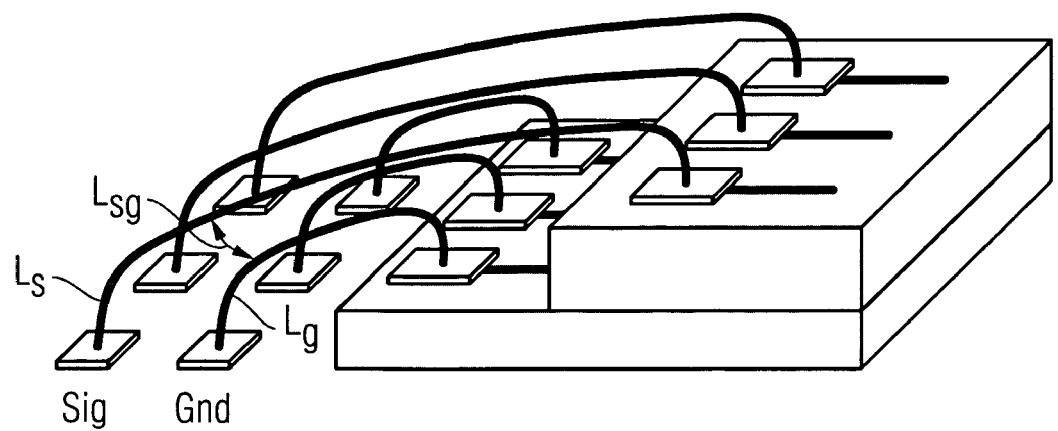
FIG. 2B shows the development of the loop inductance of the device package of the embodiment of FIG. 1A.

As illustrated with regard to FIGS. 2A and 2B. In FIG. 2A, a conventional integrated device comprising a single pad row is shown. Therein, a conventional contact pad-to-contact element bond wire routing is shown. The pads in the single pad row are arranged with a predetermined pitch wherein a signal pad is adjacent its respective power supply contact pad. The pads of the single pad rows illustrated therein provide a limited coupling between the signal and power supply bond wires which results in a loop inductance of the loop signal to power supply of $$L_{loop} = L_s + L_g - 2L_{sg}$$

wherein $L_{loop}$ is the loop inductance, $L_s$ the inductance of the signal bond wire, $L_g$ the inductance of the ground bond wire and $L_{sg}$ the coupling inductance between the signal bond wire and the ground bond wire.

As shown in FIG. 2B and with regard to the embodiment of FIGS. 1A and 1B, the pads of double pad rows are connected with bond wires wherein the bond wires of the opposing pads are vertically arranged with regard to the surface of the substrate 1. Thereby, a stronger inductive coupling $L_{sg}$ between the signal bond wire and the respective power supply bond wire can be achieved, thus reducing the loop inductance $L_{loop}$. Furthermore, a denser routing of the integrated circuit on the substrate can be achieved and more power supply bond wire connection can be added, thus additionally reducing the inductance of supply planes.

Figure 3:
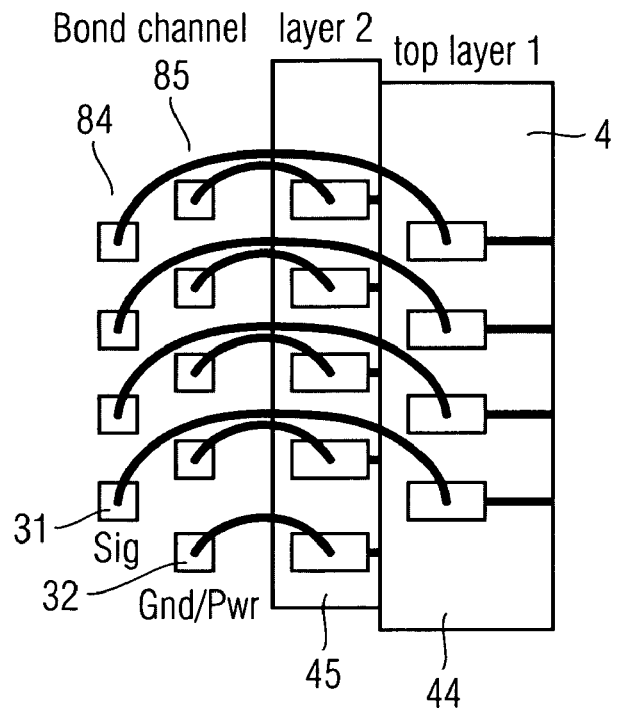
FIG. 3 shows the pad arrangement on the substrate according to a further embodiment of the present invention.

In FIG. 3 which shows a top view on the bond channel region of the integrated device according to a further embodiment of the present invention, a first and a second pad row 84, 85 are provided wherein the pads 3 of the pad rows are arranged in a staggered condition which means that the pads 3 of the pad rows are shifted such that the signal pad 31 and the power supply pad 32 associated thereto are shifted along the extension of the pad rows such that the signal pad 31 and the power supply pad 32 do not directly oppose one another in a direction perpendicular to the extension of the pad rows. Preferably, the contact elements in the different layers 44, 45 of the redistribution element have a corresponding arrangement such that an interconnection line between the signal pad and the signal contact element as well as the power supply pad to the power supply contact element are substantially parallel. The staggered arrangement of the signal pads 31 and the power supply pads 32 serves to reduce distances between the signal bond wires and the associated power supply bond wires, while keeping the wires from crossing each other and thereby reducing the risk for shorts.

Figure 4:
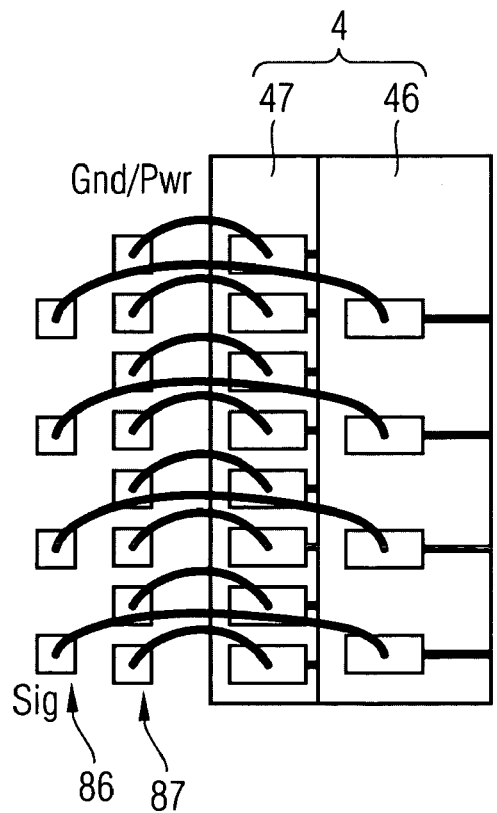
FIG. 4 shows a pad arrangement on the substrate according to a further embodiment of the present invention.

In order to further improve the high frequency signal transmission performance, the ratio of power supply pads to a given signal pad can be increased. That is, a given signal pad may have two more associated power supply pads. In the embodiment illustrated in FIG. 4, the signal pads and the power supply pads are arranged in a first and a second pad row 86, 87, respectively. With regard to the shown embodiment, the number of power supply pads in the second pad row is doubled with regard to the number of signal pads in the first pad row. Each of the pad rows 86, 87 have a different pad pitch. In particular, the signal pads are arranged with a spacing which defines a region of sufficient size to accommodate the two associated power supply pads in the second pad row. As such the two associated power supply pads have a smaller spacing (pitch) with respect to the surface of the substrate than the spacing (pitch) of the signal pads. In one embodiment, one of the two associated power supply pads is a ground pad. In one embodiment, in order that the interconnection lines between the signal pads and the signal contact elements as well as between the power supply pads and the power supply contact elements are substantially parallel, the arrangement of the contact elements on the first and second layers 46, 47 of the redistribution element 4 corresponds to the pad arrangement in the pad rows. In the embodiment shown in FIG. 4, the arrangement of the contact elements 5 is mirrored corresponding to the arrangement of the pads 3 in the pad rows 86, 87.

Figure 5:
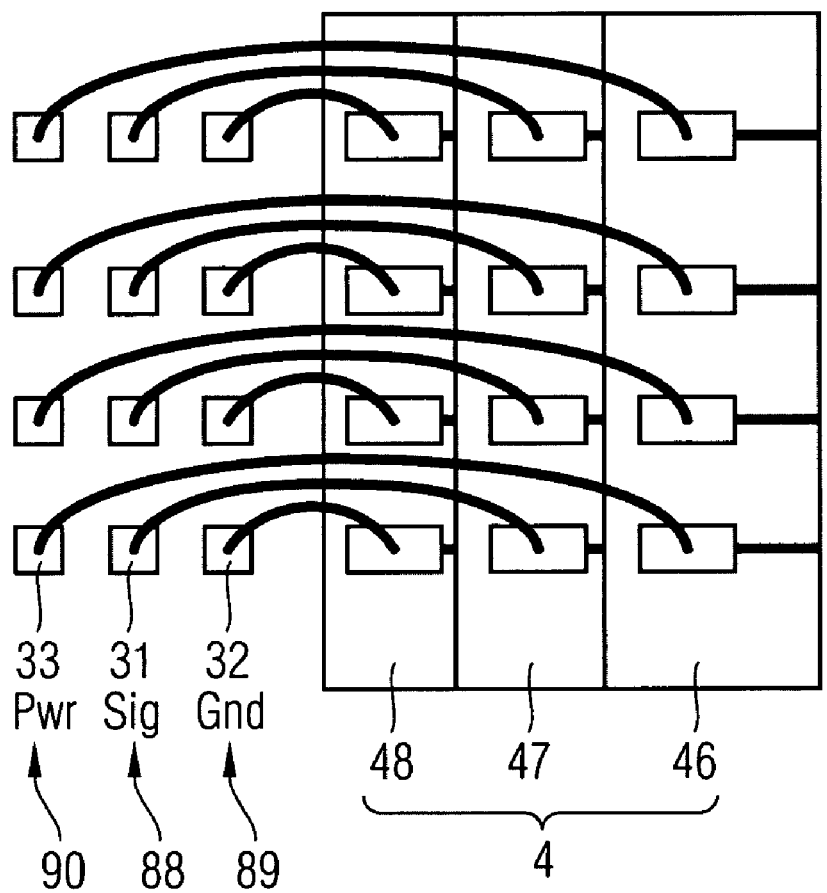
FIG. 5 shows the pad arrangement of the integrated device package according to a further embodiment of the present invention.

According to the embodiment of FIG. 5, a first, a second and a third pad row 88, 89, 90 are provided which are bonded to the same side of the bond channel to the redistribution element. The signal pads are arranged in the first pad row which is in between a second and a third pad row. The second pad row includes ground supply pads and the third pad row includes power supply pads. However, other arrangements are contemplated. For example, the first and second rows may be power supply pads and ground pads, respectively, while the third row is made up of the signal pads. The contact elements are similarly arranged on three different layers 46, 47, 48 wherein the first top layer 46 includes power supply contact elements, a second layer 47 includes signal contact elements 53 and a third layer 48 includes the ground supply contact elements. The signal pads 31, of the first pad row 88 are connected via bond wires to respective signal contact elements of the second layer 47, the ground pads of the second pad row 89 are connected to the ground contact elements of the third layer and the power supply pads of the third pad row 90 are connected to the power supply contact elements of the first layer 46 of the redistribution element 4. Thereby, the signal bond wire can be led from the bond channel 6 in a vertical arrangement relative to a ground supply and a power supply bond wire with regard to the surface of the substrate which increases the coupling inductance and thereby reduces the loop inductance of the signal transmission channel.

While the foregoing is directed to embodiments of the present invention, other and further embodiments of the invention may be devised without departing from the basic scope thereof, and the scope thereof is determined by the claims that follow.

What is claimed is:

1. A device, comprising:
a substrate;
an integrated circuit disposed on the substrate;
a plurality of pads arranged directly on a surface of the substrate and electrically connected to the integrated circuit, wherein the plurality of pads comprises:
a first row of pads comprising a plurality of signal pads for transmission of a signal; and
a second row of pads comprising a plurality of power supply pads for connection to a potential, wherein the first row of pads and the second row of pads are laterally separated from one another, and wherein each signal pad has a respective power supply pad to support the transmission of the respective signal through the respective signal pad;
a redistribution element arranged on the surface of the substrate and comprising a plurality of contact elements including a respective contact element for each of the signal pads and power supply pads, the redistribution element comprising a first redistribution layer and a second redistribution layer, wherein the contact elements for the first row of pads are arranged on the first redistribution layer and the contact elements for the second row of pads are arranged on the second redistribution layer; and
a plurality of conductors connecting each of the signal pads and power supply pads to its respective contact element.

2. The device of claim 1, wherein the plurality of conductors are bond wires.

3. The device of claim 1, wherein the respective contact elements are arranged in a manner that matches their respective signal pad and power supply pad.

4. The device of claim 1, wherein the pads of the first and second rows are arranged in a staggered relationship relative to one another.

5. The device of claim 1, wherein the first row of pads and the second row of pads are substantially parallel to one another.

6. The device of claim 1, wherein the respective power supply pad for a given signal pad is that pad in the second row of pads closest to the given signal pad.

7. The device of claim 1, wherein each of the plurality of power supply pads is for connection to a power supply potential and wherein the plurality of pads comprises a third row of pads comprising a plurality of ground pads for connection to a ground potential; wherein the first, second and third rows are laterally separated from one another and wherein each signal pad has (i) a respective power supply pad and (ii) a respective ground pad, to support the transmission of the respective signal through the respective signal pad; and wherein the plurality of conductors comprises a respective conductor coupling each of the pads in the third row to a respective contact element.

8. The device of claim 7, wherein the pads of the first, second and third rows have substantially the same pitch so that each signal pad and its respective power supply pad and respective ground pad are linearly arranged in a direction orthogonal to the direction of the rows.

9. The device of claim 8, wherein the plurality of conductors are bond wires.

10. The device of claim 9, wherein the respective conductors of a given signal pad and its respective power supply pad and respective ground pad, traverse respective coplanar paths through a common plane that extends perpendicularly from the surface of the substrate.

11. A chip, comprising:

a substrate;

an integrated circuit disposed on the substrate;

a plurality of pads arranged on a surface of the substrate and electrically connected to the integrated circuit; wherein the plurality of pads comprises:

a first row of pads comprising a plurality of signal pads for transmission of a signal; wherein the plurality of signal pads in the first row are arranged with a first pitch and the plurality of power supply pads are arranged with a second pitch, the second pitch being less than the first pitch; and a second row of pads comprising a plurality of power supply pads for connection to a potential; wherein the rows are laterally separated from one another and wherein each signal pad has a respective power supply pad to support the transmission of the respective signal through the respective signal pad; wherein the second row of pads comprises a first plurality of pads for connection to a power supply potential and a second plurality of pads for connection to a ground potential.

12. The chip of claim 11, wherein the first and second rows of pads are substantially parallel to one another.

\* \* \* \* \*